United States Patent [19]
Maeda

[11] 4,201,472
[45] May 6, 1980

[54] APPARATUS FOR CONVERTING LIGHT SIGNALS INTO DIGITAL ELECTRICAL SIGNALS

[75] Inventor: Yoshio Maeda, Katsuta, Japan
[73] Assignee: Hitachi, Ltd., Japan
[21] Appl. No.: 888,655
[22] Filed: Mar. 21, 1978

[30] Foreign Application Priority Data

Apr. 4, 1977 [JP] Japan .................................. 52-37627
Nov. 9, 1977 [JP] Japan ................................ 52-133507

[51] Int. Cl.$^2$ .............................................. G01J 1/46
[52] U.S. Cl. ...................................... 356/226; 324/132
[58] Field of Search ................ 356/218, 226; 328/143, 328/165; 364/573; 324/132; 250/211 R

[56] References Cited
U.S. PATENT DOCUMENTS

| | | | |
|---|---|---|---|
| 3,880,524 | 4/1975 | Dill | 356/118 |
| 3,892,493 | 7/1975 | Pallingen et al. | 356/226 |
| 4,002,977 | 1/1977 | Sun | 324/132 |
| 4,087,186 | 5/1978 | Vinatzer | 356/226 |

*Primary Examiner*—Rolf G. Hille
*Attorney, Agent, or Firm*—Craig & Antonelli

[57] ABSTRACT

A light signal entering a photo-electric converter means is interrupted at a certain interval of time. An electrical signal produced from the photo-electric converter means, after a predetermined amount of electrical signal is added to it, is A-D converted. The difference between the digital signal associated with the interruption of light to the photo-electric converter means and the digital signal associated with non-interruption of light to the photo-electric converter means is produced, which difference is proportional to the incident light signal. Even when the light entering the photo-electric converter means is very weak, the fact that a predetermined amount of electrical signal is added contributes to A-D conversion of good linearity. Even very weak light is thus A-D converted accurately. Noises and undesirable DC signal components contained in the two types of digital signals are offset by production of the difference.

6 Claims, 10 Drawing Figures

APPARATUS FOR CONVERTING LIGHT SIGNALS INTO DIGITAL ELECTRICAL SIGNALS

BACKGROUND OF THE INVENTION

1. Field of the Invention

This invention relates to an apparatus for converting light signal into digital electrical signals.

2. Description of the Prior Art

In an apparatus such as spectrophotometer for analyzing a specimen by use of light, the amount of light is converted into an electrical signal by such means as a phototube or photoconductive cell, and the electrical signal is processed to determine such properties as transmittance, absorbance and reflectance of the specimen. With the progress of the digital techniques, it is become possible now to process the electrical signal digitally as disclosed in U.S. Pat. No. 3,880,524 issued Apr. 29, 1975 to Frederic H. Dill et al and copending U.S. patent application Ser. Nos. 836,955 filed Sept. 27, 1977 and 843,790 filed Oct. 20, 1977 which were also assigned to the assignee of the present invention. In order to process the electrical signal digitally, the analog electrical signal produced from photo-electric converter means is converted into a digital signal by an analog-to-digital converter (hereinafter referred to as the A-D converter). For processing the digital electrical signal, the amount of light is required to be converted into an exact amount of corresponding digital electrical signal. Further, in fluorescence spectrometry, Raman spectrometry or measurement of absorbance of a specimen covering a wide range from low concentration to high concentration, not only a wide dynamic range is necessary but also even a very weak ray of lighr must be accurately converted into a digital electrical signal. Such an accurate conversion, however, is impossible by the conventional apparatuses for several reasons.

Firstly, the linear relation between input analog signal and output digital signal of the A-D converter is poor for very weak input signals. An A-D converter takes the form of a voltage-frequency transducer (hereinafter referred to as the V-F transducer) or double integrator. The satisfactory linearity of the V-F transducer is limited to about 1% of input full scale, depending on the pulse frequency converted. The linearity of the double integrator used as the A-D converter, on the other hand, depends on the accuracy of a level comparator and is satisfactory only in the range from about 0.5% to 5% of input full scale. In other words, the satisfactory lineariy of an A-D converter 10 V in full scale is exhibited in the range only from 100 mV to 10 V, so that a very weak signal less than 100 mV cannot be accurately converted into a digital electrical signal.

Secondly, an electrical signal produced from the photo-electric converter means contains various noise components including those generated by the photo-electric converter means itself and peripheral circuits. The noise components are electrically positive or negative. In the A-D converter processing only positive electrical signals, however, those weak electrical signals in the vicinity of zero level containing a large amount of noise are ignored, thus making it impossible to produce a digital amount accurately proportional to the amount of light. The noise signal level depends on various conditions, but generally ranges from about 1 mV to 1 V.

Thirdly, an undesirable DC signal component is contained in the electrical signal proportional to the amount of light, which is produced from the photo-electric converter means. This DC signal component varies with temperature. An example of the undesirable DC signal component is the dark current in a phototube or photo-multiplier, or dark resistance in the case of a photoconductive cell such as PbS cell. An offset voltage or temperature drift in the amplifier is another example. The dark resistance changes by 20 to 30% with a temperature change of about 10° C. This DC signal component makes it impossible to produce a digital electrical signal in exact proportion to the amount of light.

SUMMARY OF THE INVENTION

Accordingly, it is an object of the present invention to provide an apparatus for converting light with wide dynamic range, especially, very weak light accurately into a digital electrical signal by eliminating the effect of the noise superimposed on the electrical signal produced from the photoelectric converter means.

The light signal entering the photo-electric converter means is converted into an electrical signal and then into a digital signal by an A-D converter means. A predetermined amount of signal is added to the electrical signal applied to the A-D converter means. The difference between the digital signals associated with interruption and non-interruption of light entering the photo-electric converter is calculated. In view of the fact that a predetermined signal is added, even very weak light to be measured, which enters the photo-electric converter means, is converted with accuracy into a digital signal in the satisfactory linearity range of the A-D converter means.

DESCRPTION OF THE PREFERRED EMBODIMENTS

Figure 1:
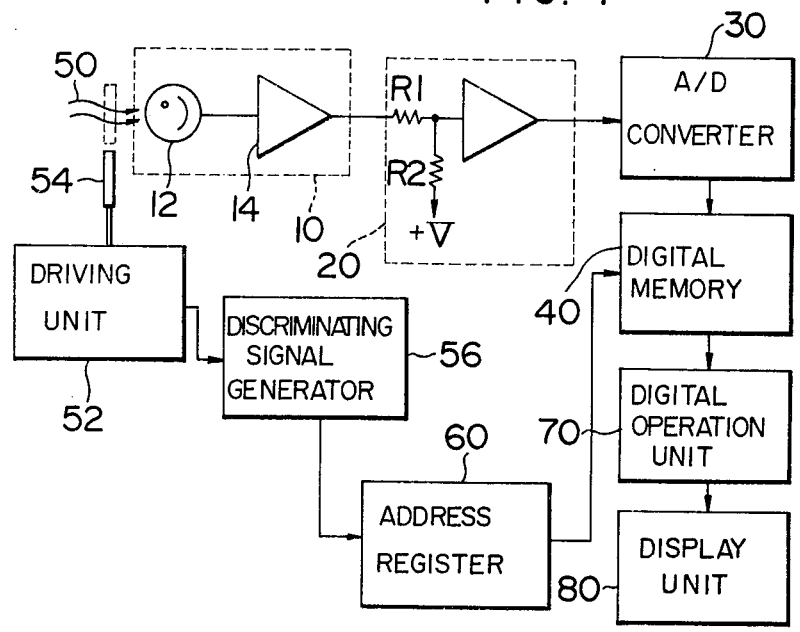
FIG. 1 is a diagram for explaining the functions with reference to a preferred embodiment of the apparatus for converting light into a digital signal according to the present invention.

A diagram for explaining the functions of a preferred embodiment of the present invention is shown in FIG. 1. A photo-electric converter 12 such as a photo-multiplier, an amplifier 14 and a power supply (not shown) for supplying power to the photo-electric converter element 12 make up a photo-electric converter means 10, which detects incident light and, after converting the amount of the light into the magnitude of voltage or other electrical unit, applies an output thereof to an adder 20. A constant voltage from a constant voltage source +V is added to the input voltage to the adder 20 through a resistor $R_2$, and an output from the adder 20 is applied to an A-D converter 30. The A-D converter 30 converts an input voltage thereto into a digital signal and supplies it to a digital memory unit 40. The incident light 50 to the photo-electric converter element 12, on the other hand, is interrupted by a shutter 54 driven by a driving unit 52 comprised of a rotary solenoid and a motor for example. In FIG. 1, the position of shutter 54 shown by a solid line is associated with non-interruption of light, while the light 50 is interrupted in the shutter position indicated by a dotted line. Whether or not the shutter 54 interrupts the incident light 50 to the photo-electric converter means 12 is determined by the driving unit 52 or a shutter position detector (not shown), with the result that discriminating signal generator 56 is actuated. The discriminating signal generator 56 supplies to an address register 60 a signal indicating whether or not the shutter 54 interrupts the incident light 50. The address register 60, which comprises a flip-flop, for example, produces a "1" signal at an output Q when the shutter 54 interrupts the incident light 50, and at an output $\bar{Q}$ when the shutter 54 fails to interrupt the incident light 50. The address register 60 controls the memory addresses of the digital memory unit 40. The outputs Q and $\bar{Q}$ of the flip-flop used as the address register 60 are connected to the one input terminal of each of two AND gates (not shown) respectively. The output of the A-D converter 30 is connected to the other input terminal of each of the AND gates. The output terminal of the AND gate is connected to different addresses of the digital memory unit 40. As a result, a digital signal produced from the A-D converter 30 is stored at different addresses of the digital memory unit 40, depending on whether output Q or $\bar{Q}$ is at "1" level, i.e., whether the incident light 50 is interrupted or not by the shutter 54. A digital operation unit 70 reads the digital signal S associated with non-interruption of the incident light 50 stored in the digital memory unit 40 and the digital signal Z associated with the interruption of the incident light 50. The operation unit 70 thus subtracts Z from S, and supplies the result of subtraction to a display unit 80, where it is indicated.

The magnitude of voltage added to the light signal is determined by the dark current in the photo-electric converter 12, an offset voltage of the amplifier 14, or temperature drifts thereof, and a satisfactory linearity range of the A-D converter 30. Assuming that the satisfactory linearity of an A-D converter with input full scale of 10 V ranges from 100 mV to 10 V, the voltage added by the adder 20 should be 100 mV or more. Even when a signal is very weak, the fact that its voltage is increased to a range with high linearity of the A-D converter contributes to accurate A-D conversion. Also, as long as the shutter 54 interrupts the incident light 50, only the voltage added by the adder 20 is accurately A-D converted. Thus, by subtracting the light-measurement digital signal Z from the light-measurement digital signal S, the incident light intensity is accurately converted into a digital signal.

A light measurement value which has been converted into a digital value by the A-D converter 30 includes the dark current in the photo-electric converter 12 and the offset voltage of the amplifier 14 regardless of whether the incident light 50 is interrupted or not. These undesirable components may be eliminated by the subtraction at the digital operation unit 70.

Figure 2:
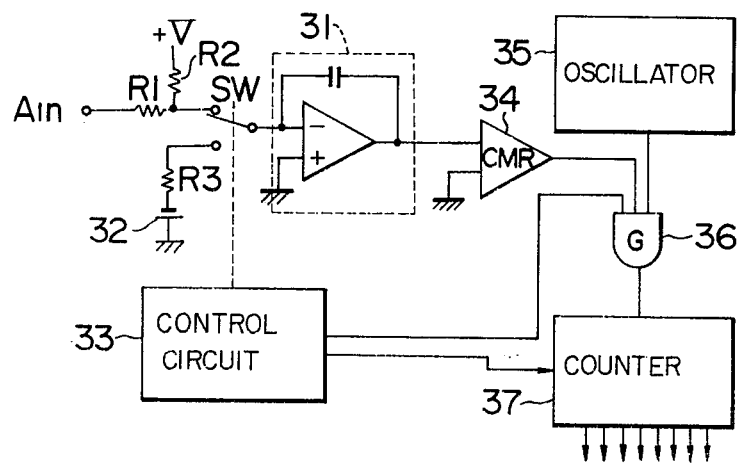
FIG. 2 is a circuit diagram showing an embodiment of adder means and an A-D converter which makes up components of the apparatus according to the invention.

A circuit diagram of an embodiment of the A-D converter and the adder circuit constituting component elements of the light measurement converter according to the present invention is shown in FIG. 2. The A-D converter is what is called of double integration type. The analog input $A_{in}$ from the photo-electric converter means, to which a constant voltage is added from the constant voltage source $+V$ through a resistor $R_2$, is integrated at the integrator 31. After integration of the input voltage to the integrator 31 for a predetermined length of time, the control circuit 33 switches the switch $SW_1$ in such a manner that the integrator 31 is integrated reversely by the voltage supplied to the integrator 31 from the constant voltage source 32 of polarity opposite to that of the input voltage through the resistor $R_3$. The comparator 34 produces a signal upon detection of the fact that the analog input voltage integrated by the integrator 31 is reduced to zero potential by reverse integration at a predetermined rate in response to the constant voltage source 32. The gate 36 is opened in response to signals from the control circuit 33 and the comparator 34 only while the integrator 31 is being reversely integrated, so that clock pulses of predetermined repetition frequency from an oscillator 35 are applied to the counter 37. The clock pulses thus applied to the counter 37 are counted thereby, thus producing a digital output Dout proportional to the analog input voltage. As shown in the embodiment of FIG. 2, the adder circuit 20 may be easily combined with the A-D converter. According to the embodiment of FIG. 2, the offset voltage in the comparator 34 or the amplifier used for the integrator 31 is constant regardless of whether or not the incident light 50 to the photo-electric converter means 10 is interrupted, and therefore may be eliminated by subtraction after digital conversion.

Figure 3:
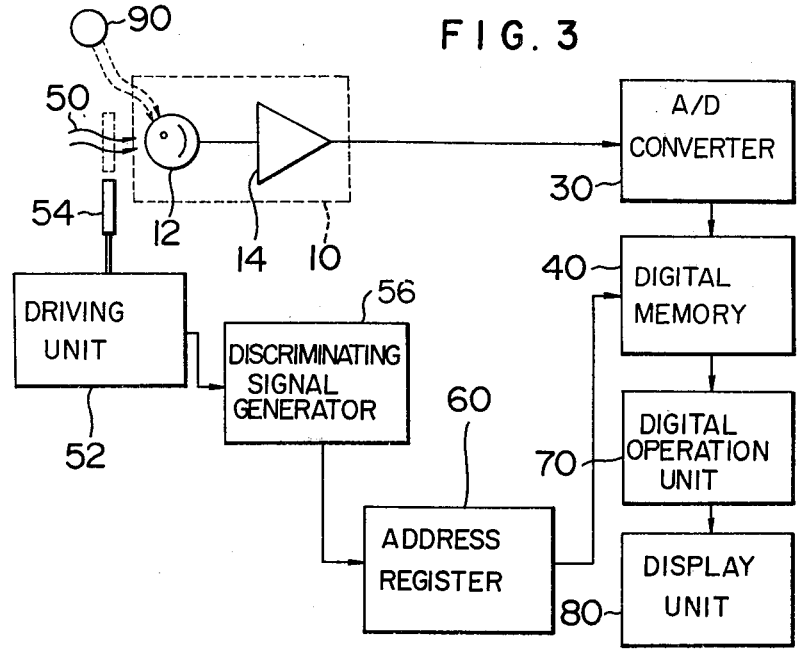
FIG. 3 is a diagram for explaining the functions with reference to another embodiment of the present invention.

A function diagram of another embodiment of the invention is shown in FIG. 3, in which like reference numerals denote like component elements as in FIG. 1. The embodiment under consideration is different from the embodiment of FIG. 1 in that a light source 90 is used instead of the adder 20 in FIG. 1. The light source 90 radiates a predetermined amount of light on the photo-electric converter 12 regardless of whether or not the incident light 50 is interrupted by the shutter 54. Even in the case where the incident light 50 is very weak, therefore, the light from the light source 90 is added for accurate conversion into a digital signal by the A-D converter 30. The difference between the light-measurement digital signal S associated with non-interruption of the incident light 50 by the shutter 54 and the light measurement digital signal Z associated with interruption of the incident light 50 is calculated by the digital operation unit 70, so that the incident light is accurately converted into a digital signal. Further, the dark current of the photo-electric converter element and the offset voltage of the amplifier are eliminated. In this embodiment, only the incident light 50 is interrupted intermittently by the shutter 54 and hence in addition to the predetermined amount of light from the light source 90, undesirable light from outside through light shielding portion (not shown) enters the detector (photo-electric converter means 10). Thus, such leakage light is advantageously cancelled by the subtraction in the digital operating unit 70.

The functions of still another embodiment of the invention will be explained with reference to FIG. 4. A photo-electric converter 12 such as a photomultiplier or photoconductive element, a pre-amplifier 14, and a power supply for the photo-electric converter 12 constitute photo-electric converter means 10. The incident light 50 interrupted by the chopper 100 is detected by the photo-electric converter means 10 and applied to the AC amplifier 110. The DC component of the input signal is eliminated by the AC amplifier 110 and only the AC component thereof is selectively amplified and applied to the adder 20. The input signal to the adder 20, being an AC signal, has both positive and negative components. A constant DC voltage is added to the input signal to the adder 20, which is thus converted into a positive voltage of single polarity and applied to the A-D converter 30. The positive voltage thus applied to the A-D converter 30 is converted into a digital signal and applied to the digital memory unit 40. The chopper 100, on the other hand, has two types of portions, one passing the incident light 50 and the other interrupting it, as an example thereof is shown in FIG. 5. The incident light 50 is thus interrupted at regular intervals by the chopper 100 rotated by the driving motor 102. The interrupted and uninterrupted states of the incident light 50 are detected by using the light source 104 and the photo-transistor 106, with the result that discrimination signal indicating whether or not the incident light 50 is interrupted is applied to the address register 60. The address register 60 comprises a flip-flop circuit, for example, and controls the memory addresses of the digital memory unit 40 in response to the discrimination signal. The light-measurement digital signal received from the A-D converter 30 is thus stored in different addresses of the digital memory unit 40 depending on whether or not the incident light 50 is interrupted. The light-measurement digital signal S stored in the digital memory unit 40 and associated with non-interruption of the incident light 50, and the light-measurement digital signal Z associated with interruption of the incident light 50 are read out by the digital operation unit 70, which subtracts Z from S and produces the difference therebetween. The digital value (S−Z) thus obtained from the digital operation unit 70 eliminates the offset voltage added to the light-measurement signals in the AC amplifier 110 and the voltage added by the adder 20, so that an absolute digital value proportional to the amount of incident light is obtained and indicated on a display unit 80 or like device.

The input voltage to the A-D converter 30 is the sum of the output voltage of the amplifier 110 and the constant voltage produced from the adder 20, and therefore, the A-D converter 30 may be operated in the most satisfactory linearity range, thus producing a digital value in exact proportion to the amount of incident light.

Figure 4:
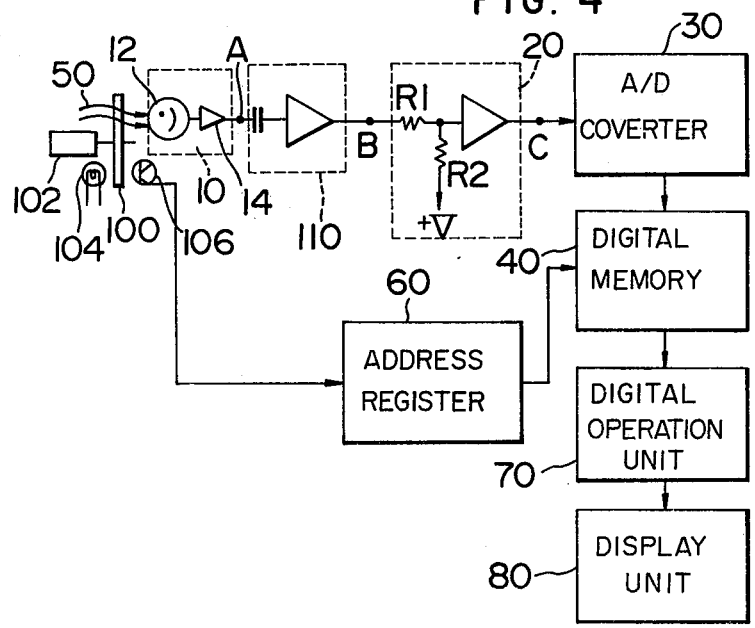
FIG. 4 is a diagram for explaining the functions with reference to still another embodiment of the invention.
Figure 5:
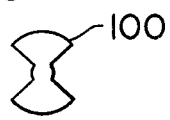
FIG. 5 is a front view of an example of the chopper making up a component of the apparatus according to the present invention.
Figures 6A, 6C, 6D:
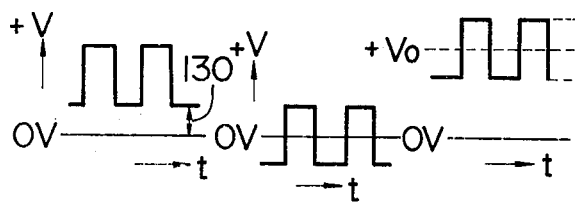
FIGS. 6a–6e are diagrams for explaining the operation of an embodiment of the present invention.
Figures 6B, 6E:
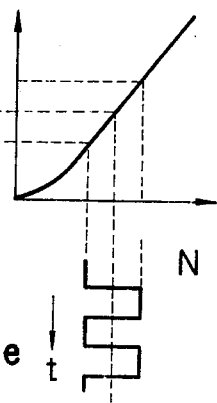

Waveforms of operating signals at various points in FIG. 4 are illustrated in FIGS. 6a–6e. FIG. 6a, FIG. 6b and FIG. 6c show voltage waveforms at points A, B and C respectively; FIG. 6d the conversion characteristic of the A-D converter 30; and FIG. 6e the digital value obtained by A-D conversion. The output voltage of the photo-electric converter means 10 contains an undesirable DC component including the dark current of the photo-electric converter element 12 and the offset voltage of the amplifier 14 which are generated regardless of whether or not the incident light is interrupted. In FIG. 6a, the undesirable DC component 130 takes the form of a positive voltage, although it may assume a negative voltage largely depending on temperatures when such a device as a photo-conductive element is used. This undesirable DC component is eliminated by the AC amplifier 110. Further, in view of the fact that a constant voltage $+V_O$ is added by the adder 20 as shown in FIG. 6c, the input voltage to the A-D converter 30 is always positive on the one hand and the satisfactory linearity range of the A-D converter is utilized on the other hand, thus producing an accurate digital output as shown in FIG. 6e. If the voltage added by the adder 20 is rendered identical to the voltage equal to the product of the duty R of the time associated with non-interruption of the incident light 50 and the input voltage range of the A-D converter, the A-D converter may be operated in the widest dynamic range.

In the last-mentioned embodiment, the incident light 50 to the photo-electric converter 12 is interrupted at regular intervals of time, and at each time of interruption, subtraction is taken at the digital operation unit 70. As a result, the dark current of the photo-electric converter element 12, the drift of the amplifier used in the photo-electric converter means 10 and the drift in the integrator used in the A-D converter or the adder 20 are compensated for, thereby producing a digital value in exact proportion to the amount of the incident light.

Further, the voltage $V_O$ added by the adder 20 is determined regardless of the magnitude of the undesirable DC components including the dark current of the photo-electric converter element or the offset voltage of the amplifier. The voltage $V_O$ may be valued at about 5 V for an A-D converter with the full scale of 10 V, for example.

The digital memory unit, address register and digital operation unit used in the embodiments described above are easily realized by a digital computer, for example.

It will be understood from the foregoing description that according to the present invention, an absolute digital value in exact proportion to the amount of light is produced even when the incident light is very weak, and that the drifts generated in the photo-electric converter means and A-D converter are compensated for while at the same time assuring stable operation of the A-D converter.

I claim:
1. An apparatus for converting a light signal into a digital electrical signal comprising:
   (a) first means for converting object light to be measured into an electrical signal,
   (b) second means for converting an electrical output signal of said first means into a digital signal,
   (c) third means for selectively interrupting the incident light entering said first means,
   (d) fourth means for increasing the electrical input signal to said second means by a predetermined amount,
   (e) fifth means for storing a first digitial signal associated with the interruption by said third means of said object light on said first means and a second digital signal associated with the non-interruption by said third means of said object light on said first means, said first and second digital signals being produced from said second means, and
   (f) sixth means for calculating the difference between said first and second digital signals stored in said fifth means.
2. An apparatus according to claim 1, in which said fourth means is interposed between said first means and said second means for adding a predetermined amount of electrical signal to the electrical signal applied to said second means.

3. An apparatus according to claim 1, in which said fourth means radiates a predetermined amount of light signal on said first means.

4. An apparatus according to claim 1, in which said third means interrupts said object light at regular intervals of time.

5. An apparatus for converting a light signal into a digital electrical signal comprising:
   (a) first means for converting object light to be measured into an electrical signal,
   (b) second means for converting an electrical output signal of said first means into a digital signal,
   (c) third means for interrupting the incident light to said first means at regular intervals of time,
   (d) fourth means for increasing the electrical input signal to said second means by a predetermined amount,
   (e) fifth means for storing a first digital signal associated with the interruption by said third means of said object light on said first means and a second digital signal associated with non-interruption by said third means of said object light on said first means, said first and second digital signals being produced from said second means,
   (f) sixth means for calculating the difference between said first and second digital signals stored in said fifth means, and
   (g) seventh means interposed between said first means and said fourth means for eliminating the DC signal components of the electrical signal produced from said first means.

6. An apparatus according to claim 5, which said fourth means is interposed between said seventh means and said second means for adding a predetermined amount of electrical signal to the electrical signal applied to said second means.

* * * * *